(12) United States Patent
Badar

(10) Patent No.: US 6,937,916 B2
(45) Date of Patent: Aug. 30, 2005

(54) AUTOMATIC RECOGNITION OF LOCATOR DIE IN PARTIAL WAFERMAP PROCESS

(75) Inventor: Omar Mohd Badar, Ampang Selangor (MY)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 10/446,585

(22) Filed: May 28, 2003

(65) Prior Publication Data

US 2004/0254669 A1 Dec. 16, 2004

(51) Int. Cl.$^7$ .......................... G06F 19/00; H01L 21/46
(52) U.S. Cl. .................... 700/121; 700/114; 700/125; 250/208.1; 438/33; 438/462; 356/237.4; 356/237.5; 382/151
(58) Field of Search ................................ 700/114, 116, 700/121, 125; 438/33, 462; 430/311; 356/237.4, 237.5; 382/151

(56) References Cited

U.S. PATENT DOCUMENTS

| | | | | |
|---|---|---|---|---|
| 6,111,244 A | * | 8/2000 | Wang | 250/208.1 |
| 6,149,047 A | * | 11/2000 | Oda | 228/6.2 |
| 6,156,625 A | * | 12/2000 | Balamurugan | 438/462 |
| 6,216,055 B1 | * | 4/2001 | Balamurugan et al. | 700/121 |
| 6,809,802 B1 | * | 10/2004 | Tsukamoto et al. | 355/72 |

* cited by examiner

Primary Examiner—Leo Picard
Assistant Examiner—Douglas S. Lee
(74) Attorney, Agent, or Firm—W. James Brady, III; Frederick J. Telecky, Jr.

(57) ABSTRACT

An off-line partial wafer scanner system is disclosed that resolves partial wafermap related issues that result holt-lot in semiconductor assembly. The system eliminates the need to teach locator die at die attach (die bonder) machine. The reaching of partial map locator die is done in die interface areas instead of at the die bonder machine. This resolves the die quantity discrepancies issue, die bonder operator error and missing locator die information due to error made at the die bonder. An image-processing algorithm is employed to achieve reliable off-line locator die teaching system. In partial wafermap processing, the locator die is recognized by utilizing a vision system. A production operator records the wafer identification, and quarter or halves the wafer using a saw machine. The production operator scans the first quarter Q1 or first half H1 with a scanner and determines the locator die location as well as exact quantity of dies. The production operator uploads to a wafermap server the locator die location as well as exact quantity of dies. When dies are mounted from a partial wafer the production operator downloads from the wafermap server the locator die coordinates to a die mounting machine and the dies from any of the partial wafers are mounted using the downloaded locator die coordinates.

25 Claims, 5 Drawing Sheets

AUTOMATIC RECOGNITION OF LOCATOR DIE IN PARTIAL WAFERMAP PROCESS

FIELD OF INVENTION

This invention relates to partial-wafer wafermap process utilizing a vision system and more particularly to automatic recognition of locator die in a partial wafer.

BACKGROUND OF INVENTION

Partial wafermap process is a process where a single silicon wafer is cut into two or more pieces for the reason of smaller lot quantity. The wafers are usually halved or quartered. Before the implementation of inkless wafer processing, an ink dot placed on a die by a prober in a wafer fab identifies a bad die. No ink dot on the die represents a good die. When the inked wafer is sent over to an assembly and test site, the wafer could be halved or quartered to accommodate smaller lot quantity. This is when the term "partial lot" is used. Any part of the halved or quartered wafer (normally termed as H1, H2 for halved wafer, and Q1, Q2, Q3, Q4 for quartered wafer) could be processed on any die mounting machine without requiring any relationship between the partial wafers.

A wafermap (or inkless system) eliminates the inking process at the prober in the wafer-fab. Replacing the ink for marking the bad dies from the good ones, a map file is created for each of the probed wafer that indicate the location of good and bad dies based on known position termed as reference die. When one particular wafer is halved or quartered, one half or one quarter of the wafer has a reference die. There is a need for a new reference die for each of the partial wafers.

Prior art methods are described in U.S. Pat. No. 6,216,055 of Balamurugan et al. Entitled "Partial Semiconductor wafer processing" and U.S. Pat. No. 6,174,788 of Balamurugan entitled "Partial Semiconductor Wafer Processing With Multiple Cuts of Random Sizes." These patent are incorporated herein by reference. The prior art teaches a method of providing a locator die teach by the production operator on die mounting machine (pick and place equipment).

The current process does the following steps:
1. Lot started
2. Send wafer to partial production operator (PO).
3. PO will record wafer identification, and quarter or half wafer using saw machine.
4. Q1 for first quarter or H1 for first half will be issued to the line, and Q2, Q3, Q4 or H2 will be kept in the die bank.
5. Die mounting machine PO will do a locator die teach on the die mounting machine.

In step 4 above, the die exact quantity of the partial wafer is not known. Due to this, a quantity estimate will have to be done by the partial operator. This will cause quantity discrepancies at the die bonder causing yield losses and other lot processing problems.

In step 5 above is the step that needs to be taken by the machine operator in order to reach the locator die position for each H1 or Q1 wafer so that the locator die coordinate is recorded for the subsequent processing of Q2, Q3, Q4 or H2 or H2 parts.

FIG. 1 illustrates the flow of partial map process at the die bonder in the prior art. The steps are:
1. Load partial wafer to die bonder.
2. Download wafermap data for whole wafer.
3. Display the whole wafer in die bonder monitor.
4. Move the wafer table to first die pickup position.
5. Move display cursor to first die pickup position.
6. Teach two limit dies in X direction.
7. Teach two limit dies in the Y direction.
8. Using limit die coordinates information remove other partial wafer dies from map.
9. Start die mount.

The above process also requires dependencies of the system on all die bonder machine operators. Any error made in this process will prevent further processing of H2 or Q2, Q3 or Q4 part due to lack of locator die.

The current method is error prone, and is limited. It is highly desirable to provide a method where there is no need for teaching of the locator die at the die mounting machine.

SUMMARY OF INVENTION

In accordance with one embodiment of the present invention an automatic recognition of the locator die in a partial-wafer wafermap processing is achieved utilizing a vision system.

In accordance with an embodiment of the present invention a new method of partial-wafer wafermap processing is provided that eliminates the teaching of the locator die in the die bonder that comprises the steps scanning the wafer and determining the locator die location as well as exact quantity of dies; uploading to a wafermap server the locator die location as well as exact quantity of dies; and mounting the dies from any of the parts at a die mounting machine using the downloaded locator die coordinates.

In accordance with another embodiment of the present invention an improved apparatus used to scan the wafer is provided that holds the wafer against the scanner without touching the scanner glass by a vacuum inlet.

In accordance with another embodiment of the present invention an improved vision processing method to recognize the locator die is provided including recognizing the wafer diameter, recognizing quarter or half wafer from the scanned images, verifying reference die validity and recognizing the locator die coordinates.

DESCRIPTION OF PREFERRED EMBODIMENT

Figure 2:
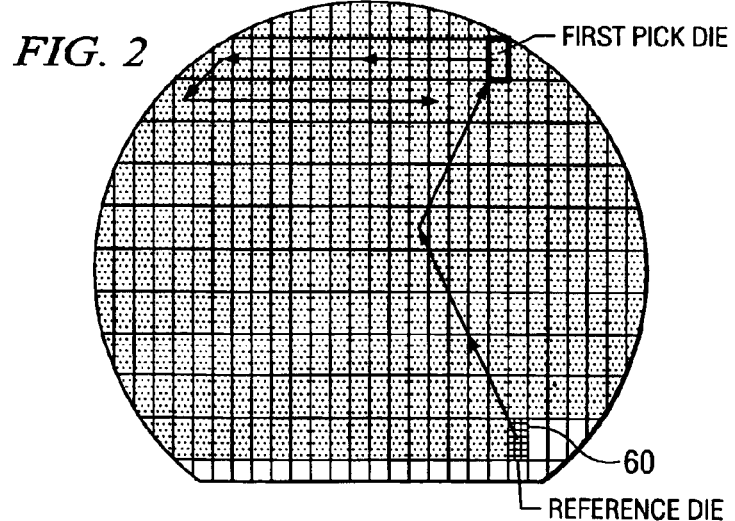
FIG. 2 illustrates an inkless wafer before quartering/halving process.

Referring to FIG. 2 there is illustrated a full inkless wafer before quartering/halving process. The wafer flat is at the bottom of the drawing and the reference die 60 is on the lower right adjacent the mirror die as marked. This is the reference position in the full wafer wafermap processing. In the mounting sequence, the pick and place equipment moves from the reference die to the first pick die position at the top upper right where there is a full die. The pick up sequence goes from right to left along the top row to the last full die in the row and then down one row and then from left to right on the second row. At the end of the second row the pick up drops down one row and goes from right to left again. The process is repeated till the last good die is picked. The location of good and bad dies is based on the known reference die position.

Figure 3:
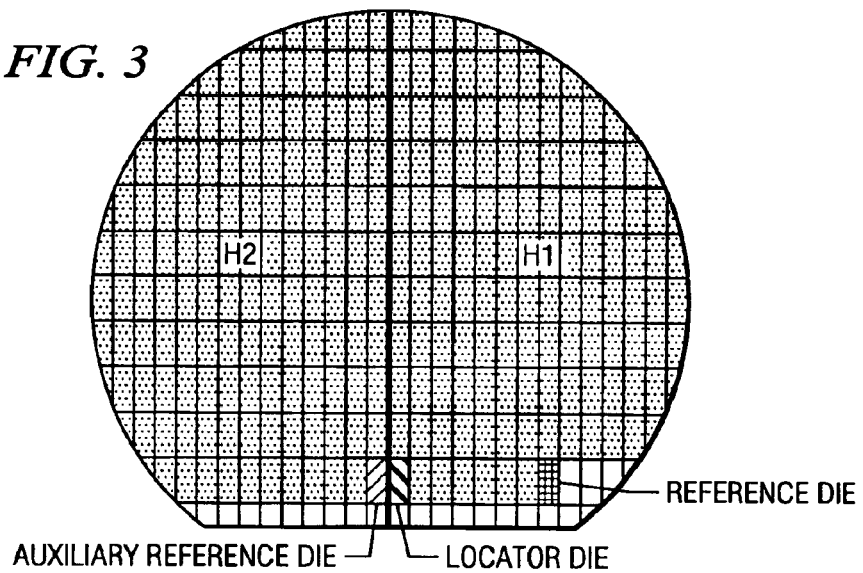
FIG. 3 illustrates an inkless wafer after halving process.
Figure 4:
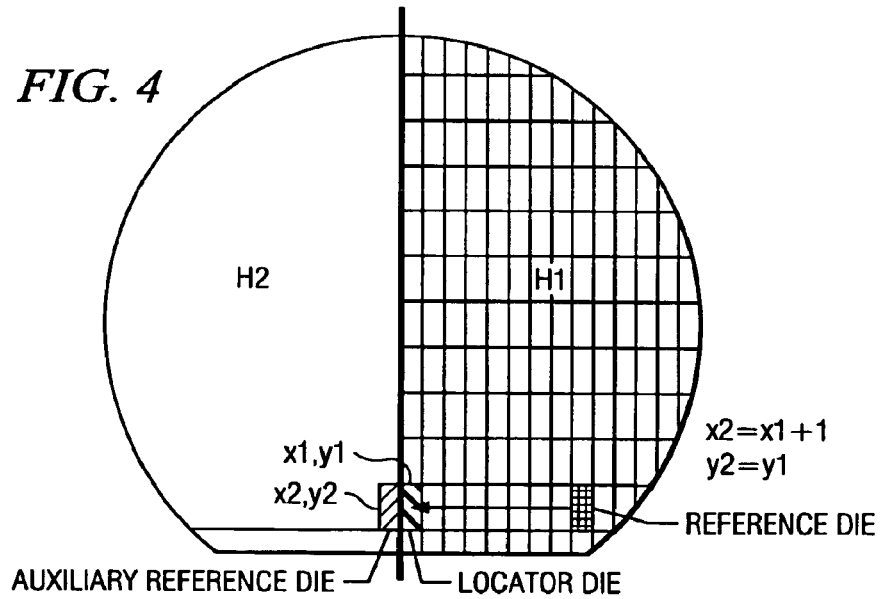
FIG. 4 illustrates the coordinates of the locator die in the wafer half with the reference die and the relative location of the auxiliary reference die in the other wafer half

When one particular wafer is halved or quartered, a new reference die needs to be identified for each of the partial wafers. FIG. 3 illustrates an inkless wafer after halving process. FIG. 3 there is shown the saw separation between the two haves by the space and the position of the locator die. From the co-ordinate position of the locator die the reference die location is determined for half H1 and the auxiliary reference die position is known for half H2. This is illustrated in FIG. 4 with a solid line through the wafer representing the cut. If locator die coordinate is (x1, y1) then auxiliary reference die (x2,y2) is x2=x1+1 and y2=y1.

Figure 5:
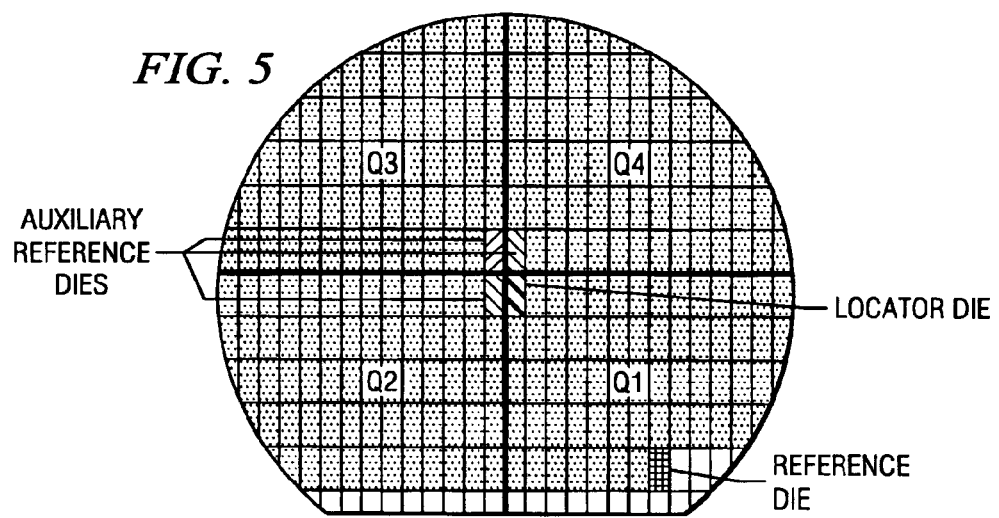
FIG. 5 illustrates an inkless wafer after a quartering process.
Figure 6:
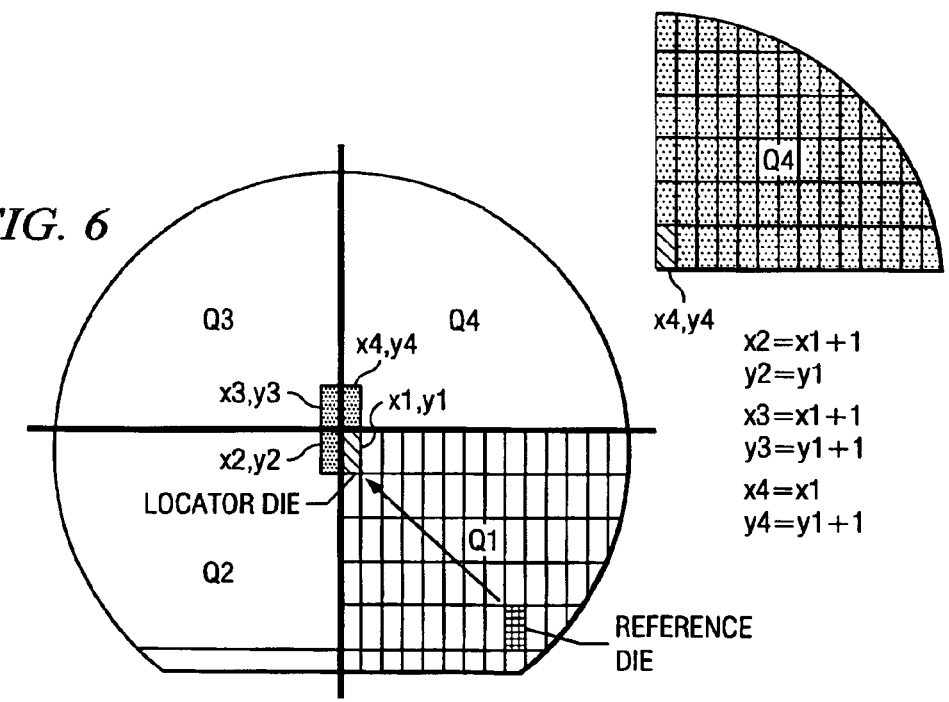
FIG. 6 illustrates the coordinates of the locator die in the wafer quarter with the reference die and the relative location of the auxiliary references die in the other wafer quarters.

FIG. 5 illustrates an inkless wafer after quartering process. In FIG. 5 there is shown the saw separation by the space between the quarters and the position of the locator die. From the co-ordinate position of the locator die the reference die location is determined. The locator die position is shown in FIG. 5 for the quartered wafer. The locator die is in the same quarter as the reference die but near the center of the wafer at the junction of the vertical and horizontal cut as illustrated at x1, y1. From the coordinate position of the locator die location is determined the auxiliary reference die position for the other quarters Q2, Q3 and Q4. See FIG. 6. The auxiliary reference die for the second quarter Q2 is at x2, y2 where x2=x1+1 and y2=y1. The auxiliary reference die for the third quarter Q3 is at x3, y3 where x3=x1+1 and y3=y1+1. The auxiliary reference die for the fourth quarter Q4 is at x4, y4 where x4=x1 and y4=y1+1. For additional discussion see above cited U.S. Pat. Nos. 6,216,055 and 6,174,788 incorporated herein by reference.

Figure 7:
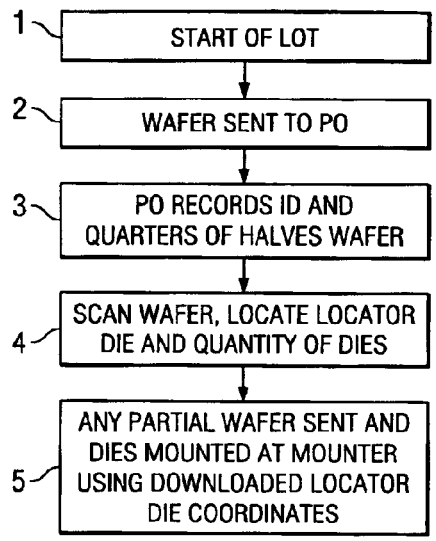
FIG. 7 illustrates a new partial wafermap procedure that eliminates the teaching of the locator die in the die bonder according to one embodiment of the present invention.

The new process takes the following steps illustrated in FIG. 7.

Step 1 the Lot is started.

Step 2 the wafer is sent to partial process production operator (PO).

Step 3 the production operator (PO) will record the wafer identification, and quarters or halves the wafer using the saw machine.

Step 4 the first quarter Q1 or first half H1 is scanned and locator die location as well as exact quantity of dies will be uploaded to a wafermap server (WISH) 15.

Step 5 any of the parts Q1, Q2, Q3, Q4 or H1 or H2 can be issued to a die mounting machine and the remaining sent to the die bank. The wafermap server (WISH) outputs to the die mounting machine the locator die coordinates. The partial wafers can be sent to different die mounting machines such as Die Mounting machine 1 or Die Mounting machine n.

Figure 1:
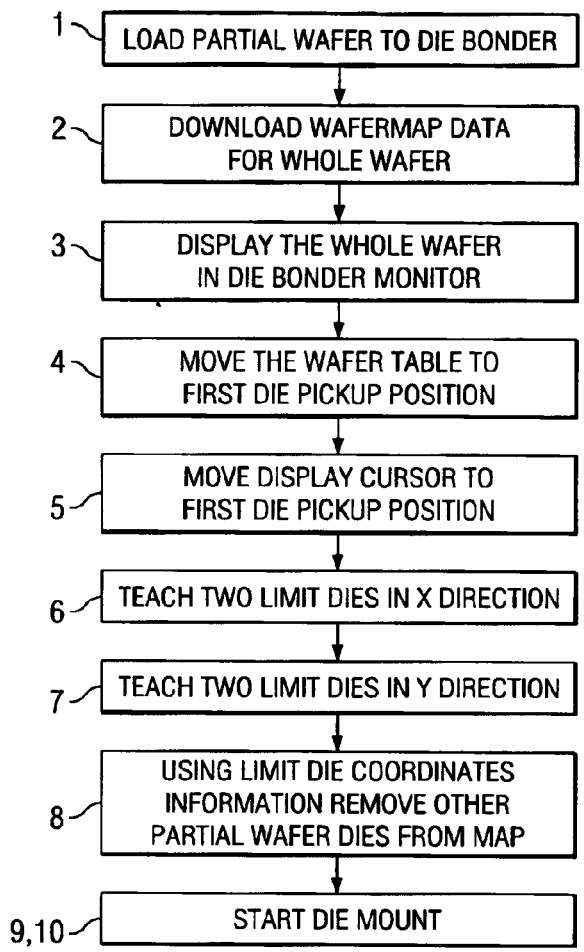
FIG. 1 illustrates the flow of partial map process at the die bonder in the prior art.

When the quarters Q2, Q3, Q4 or H2 are used on line no further teaching of locator die is required at the die mounting machine as the locator die coordinate will be down loaded to the bonder machine or die mounting machine. There no longer is the need for steps 6 and 7 in FIG. 1 to teach the two limit dies in the X and Y directions.

Figure 8:
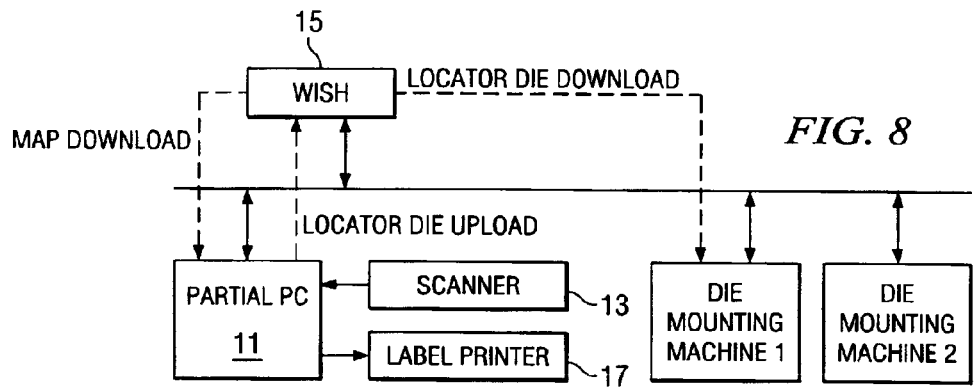
FIG. 8 there is illustrated a block diagram of the system according to one embodiment of the present invention.

FIG. 8 illustrates a block diagram of the system according to one embodiment of the present invention. The system includes a personal computer PC 11 where the image processing software is used to recognize the locator die and a scanner 13 for acquiring the partial wafer image. A mentioned in the steps above in Step 4 the first quarter Q1 or first half H1 is scanned and the locator die location as well as exact quantity of dies will be uploaded to a wafermap server (WISH) 15. The software can be broken down into the seven major parts of 1) User interface.
2) Image processing engine.
3) Telnet client
4) FTP client
5) Flatbed scanner interface
7) Barcode label printer.

The user interface is designed such that it will provide easy operation and require the least number of keystrokes. Key feature of the user interface includes a zoom window for magnified view of scanner wafer, square box cursor that is automatically resized based on die geometry and a cross hair.

A good set of image processing library is used to perform the computationally intensive task in a timely manner. Extensive image analysis method is utilized to automatically scan the wafer image, perform basic image processing, and perform higher level image processing to recognize the locator die coordinates with respect to reference die coordinates. The system at the PC 11 includes as input the partial wafer image from the scanner and the wafermap file based on wafer identification number (to identify the reference die, die size, wafer diameter, and bin quantity).

The image processing method used to recognize the locator die includes the steps method of recognizing the wafer diameter, method of recognizing quarter or half wafer from the scanned images, method of verifying the reference die validity and method of recognizing the locator die coordinates.

Figure 9:
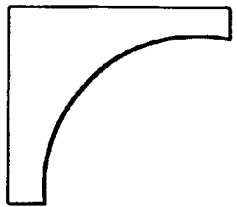
FIG. 9 illustrates the image of a quarter wafer after binary operation.
Figure 10:
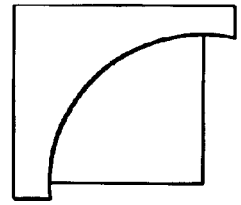
FIG. 10 illustrates a window set in the image of a quarter wafer.

The method of recognizing the wafer diameter is achieved by converting the wafer image to a binary image and by counting the white pixels. FIG. 9 illustrates the image of a quarter wafer after binary operation. The black area represents the area beyond the wafer and dies. A window is set after finding the tangent of the window. See FIG. 10. The white pixel count is the pixels within the window. The number of white pixels determines the wafer diameter. The white pixel count determines the diameter of the wafer by means of a lookup table and image resolution (Dot per inch) method.

The method of recognizing quarter or half wafer from the scanned images is uses the image aspect ratio. Typical image aspect ratio for partial wafer is 1:1 (Horizontal: vertical), and typical image aspect ratio for half wafer is 1:2. Based on this concept, any aspect ration of less than 0.7 is used to decide that the particular wafer being scanned is half wafer.

Figure 11:
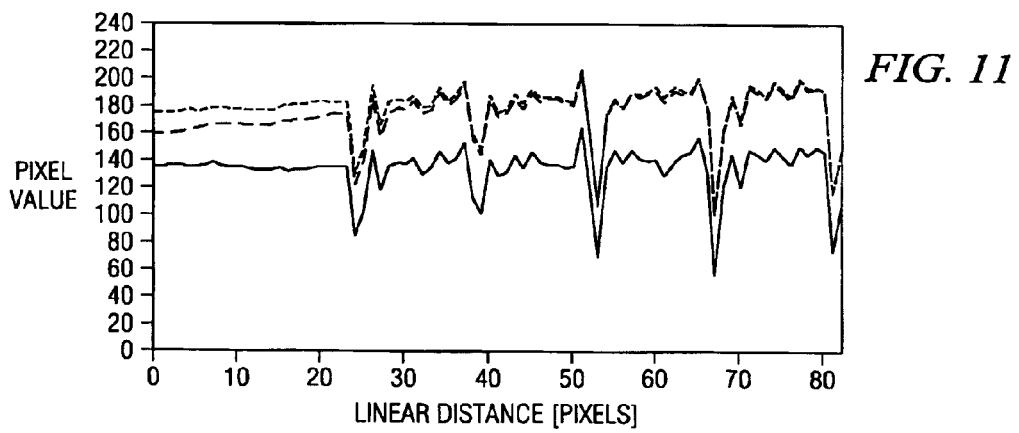
FIG. 11 is a plot of linear distance vs. pixel value to show the profile of the cross section of a reference die.

The selection of reference die is based on an operator judgment. However, there is a software check made to verify whether the selection is valid or otherwise. A cross section is selected across the selected reference die, and the pixel profile is analyzed. There should be no valley of the left side of the selected die. FIG. 11 is a graph to show the pixel profile of a cross section to determine the location of a reference die. It is a plot of pixel values vs. linear distance.

There are two methods of recognizing the locator die coordinates with one a fast way and the second a slower but more accurate way.

Figure 12:
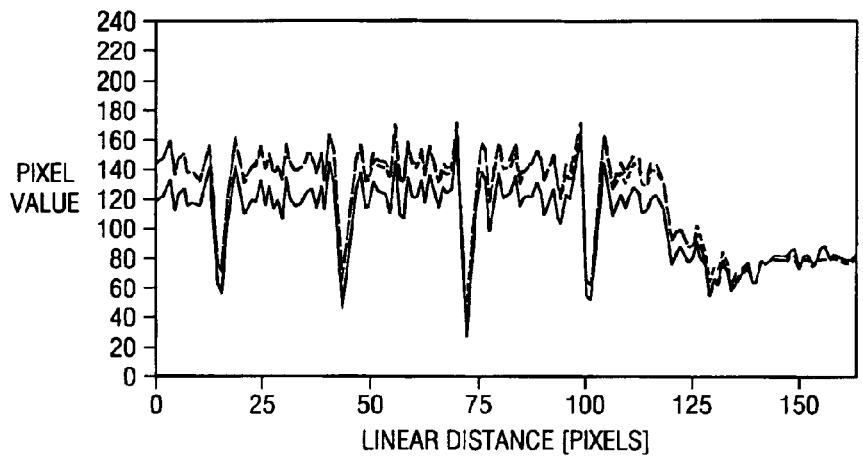
FIG. 12 is plot of linear distance vs. pixel value to show the pixel profile of a horizontal cross section to determine the location of a locator die.
Figure 13:
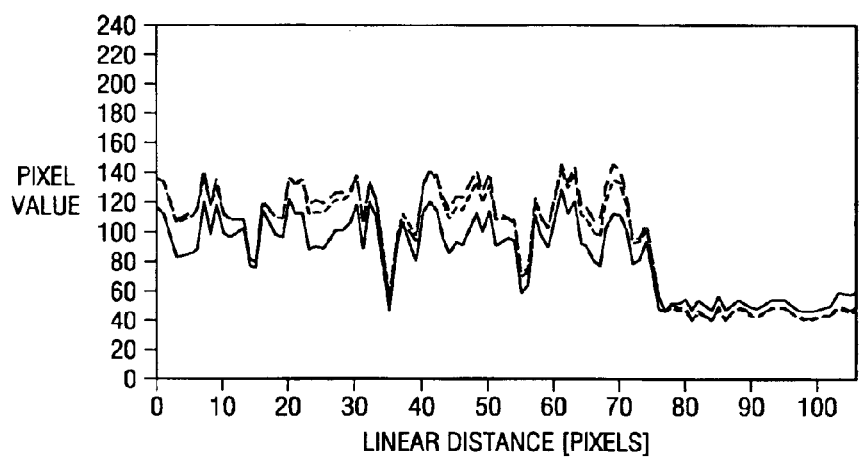
FIG. 13 is plot of linear distance vs. pixel value to show the pixel profile of a vertical cross section to determine the location of a locator die.

The fast method employs pixel profiling/histogram method. For the example of a quarter die with the corner of the partial wafer at the bottom right the histogram pixel profile should not have any valley on the right side of the locator die when the selected horizontal cross section for the histogram is taken. FIG. 12 is a graph to show the pixel profile of a horizontal cross section to determine the location of a locator die. For the vertical cross section of the locator die the locator die coordinates are checked by the absence of a valley at the bottom of the locator die. FIG. 13 is a graph to show the pixel profile of a vertical cross section to determine the location of a locator die. The lowest part of the valley is used to determine the edges of the die. The formula to calculate the grayscale value of each pixel is described as Gray=(222*IR+707*IG+71*IB)/1000.

The more accurate method in determining the coordinates of the locator die the following steps are taken:
1) Threshold process where the image threshold is automatically adjusted using the common gray threshold function.
2) Binary gradient to enhance the edges,
3) Dilated gradient to enhance the edges,
4) Image fill to further outline the die edges, the noises were further eliminated using common image processing method,
5) Image erosion techniques to further outline the edges, and
6) Vertical/horizontal edge detection using gradient north and gradient west the edges vertical and horizontal is separated for the final measurement. From this step, the vertical and horizontal edges are clearly defined and measured using the edge profile method.

Upon the initialization of the application, a telnet session is created to run in the background. In this method, all interaction with WISH is executed by entering a remote command from the application where the response will be captured and analyzed for further processing. The most important command used is a command to upload the locator die information as well as to update wafer status. The telnet session is created using net ActiveX control provided in Visual Basic 6.0. A background VT100 emulator performs data transaction WISH and application. Using this method, immediate response and status of every command sent to WISH can be received in real time. Other more common method of using RSH will not provide the same advantage if compared to this background telnet/VT100 approach. A typical command sent through the telnet session:

"find/wish5.0/img/I*/* & Wafer.Lot.No & "*" which will list down
all available wafer in the die lot
"uws5.8-n" &no_of_part & "&-w" & wid & '-C"
the above command, a Unix script was written by IT support to list wafer id and wafer number according to the wafer lot number.

FTP client is used to download wafermap file from WIH during the processing of the wafer image. Information such as reference die coordinate, die size, reference die type, die bin quantity and other information is extracted from the downloaded file. This session used FTP ActiveX control.

An embedded web browser is included in the application to simplify the access to WEB WAMP.

For each scanning job, a label containing quantity of each part as well as other information such as wafer number and lot number is automatically printed. A canned command is sent to a printer through a printer port. A method of direct access is employed to query the status of the printer. This method uses IO ActiveX control.

Figure 14:
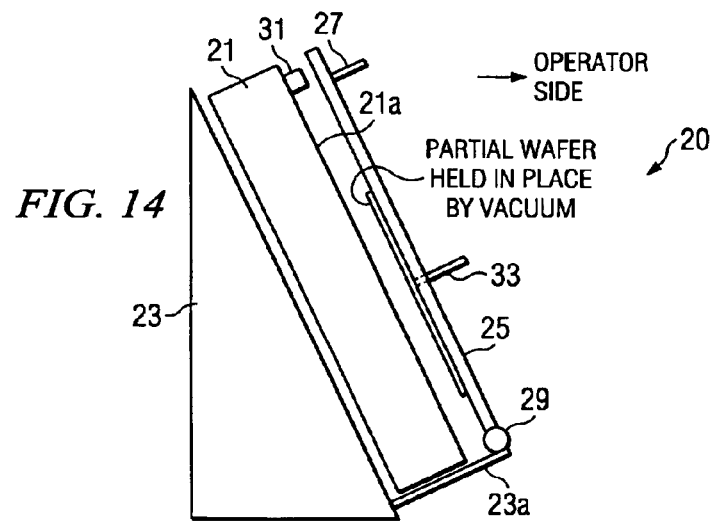
FIG. 14 illustrates a side view of the scanning apparatus according to one embodiment of the present invention.

A custom made Off-line Partial Wafer Scanner system described below is used according to one embodiment of the present invention. The partial wafer (Q1 or H1) will be placed in a custom-made wafer scanner jig illustrated in FIG. 14. FIG. 14 is a side view of an apparatus 20 with the flat-bed scanner 21 according to one embodiment of the present invention. The apparatus comprises a generic flat bed scanner 21, a scanner holder 23 that tilts the flat bed scanner 21 at an angle, and a custom designed flap 25 with a handle 27 and hinged with hinge 29 to a resting base 23a of the scanner holder 23. The scanner holder 23 in the side elevation view is in the shape of a right angle triangle with a scanner resting base support 23a extending perpendicular to the slanted surface for receiving. The hinge 29 is connected to the extend end of the support 23a. The scanner is positioned this way for accessibility, a small footprint, and to adapt to generic design of most flatbed scanners which use a guide rail on one side, but a roller on the other side for its scanning head. In this apparatus, the scanner is tilted at 50 to 60 degrees. Placing the scanner at a steeper degree can prevent from operating properly. Placing the scanner at an angle of 0 to 50 degrees increases the risk of the wafer falling onto the glass surface causing wafer breakage or damage. The custom designed flap 25 with a handle 27 and hinged at the base replaces the original flap of the scanner. A flap stopper 3 extends from the scanner to keep the flapper spaced from the scanner. A vacuum inlet 33 in the flap 25 is attached to a vacuum source to hold the wafer's flip side while the active surface if the wafer is facing toward the scanner glass surface 21a. A sufficient amount of sealing about the flap 25 is provided by the flap 25 or by the flap stopper 31 or both to achieve a vacuum between the scanner and the flap 25. The angle at which the flap is positioned against the scanner glass surface is critical as it can determine the image quality of the wafer being scanned due to reflectivity problem. This is achieved by using adjustable stopper at the top of the scanner holder. Due to the fact that the wafer is being held in place by the vacuum, the active surface of the wafer is prevented from touching the glass surface of the scanner. This prevents any circuit metalization damage on the wafer active surface. The wafer will be held back against a plate by vacuum that exists in the plate.

Other partial wafers from other types of cuts likewise may be used having the locator die position as discussed in the referenced patents.

The benefits of the new process are:
1) Eliminate manual teaching of locator die, which is human dependent and prone to error.
2) Eliminate the need to issue H1 or Q1 part before any other part.
3) Eliminate Q2, Q3, Q4 or H2 hold lot due to missing locator die reference caused by missing H1, Q1 or improper teaching or locator die.

4) Exact part quantity can be determined at lot start eliminating wrong lot quantity.

Other partial wafers from other types of cuts likewise may be used having the locator die position as discussed in the referenced patents.

Although the present invention and its advantages have been described, it should be understood that various changes, substitutions and alterations could be made without departing from the spirit and scope of the invention as defined by the appended claims.

What is claimed is:

1. A method of partial-wafer wafermap process comprising the steps of:
   scanning the wafer and determining the locator die location as well as exact quantity of dies;
   uploading to a wafermap server the locator die location as well as exact quantity of dies;
   downloading from the wafermap server the locator die coordinates to a die mounting machine; and
   mounting the dies from any of the parts at the die mounting machine using the downloaded locator die coordinates.

2. The method of claim 1 including the steps of recording the wafer identification and cutting the wafer using a saw machine.

3. The method of claim 2 wherein a production operator records the wafer identification, and quarter or halves the wafer using a saw machine.

4. The method of claim 2 wherein said scanning step includes said production operator scanning the first quarter Q1 or first half H1 and determining said locator die location as well as exact quantity of dies and wherein said uploading step includes said production operator uploading said locator die location as well as exact quantity of dies to said wafermap server.

5. The method of claim 4 wherein said downloading step includes downloading from the wafermap server the locator die coordinates to the die mounting machine.

6. A method of partial-wafer wafermap process comprising the steps of:
   downloading from a wafermap server the locator die coordinates to a die mounting machine; and
   mounting the dies from any of the parts at the die mounting machine using the downloaded locator die coordinates.

7. The method of claim 6 including the steps before downloading of scanning the wafer and determining the locator die location as well as exact quantity of dies; and
   uploading to a wafermap server the locator die location as well as exact quantity of dies.

8. A method of partial-wafer wafermap process comprising the steps of:
   scanning the wafer and determining the locator die location as well as exact quantity of dies before any wafer mounting process and
   uploading to a wafermap server the locator die location as well as exact quantity of dies before any wafer mounting process.

9. A method of partial-wafer wafermap process comprising the steps of:
   scanning the wafer and determining the locator die location as well as exact quantity of dies:
   uploading to a wafermap server the locator die location as well as exact quantity of dies: and
   mounting the dies from any of the partial wafer at the die mounting machine using the downloaded locator die coordinates.

10. The method of claim 9 wherein said scanning step includes image processing including performing on the image a threshold, binary gradient, dilated gradient, image fill, image erosion, and vertical/horizontal edge detection.

11. A method of partial-wafer wafermap process comprising the steps of:
    recording the wafer identification;
    cutting the wafer using the saw machine;
    scanning the first quarter Q1 or first half H1 of wafer and determining the locator die location as well as exact quantity of dies; said scanning step including image processing including performing on the image a threshold, binary gradient, dilated gradient, image fill, image erosion, and vertical/horizontal edge detection;
    uploading to a wafermap server the locator die location as well as exact quantity of dies;
    downloading from the wafermap server the locator die coordinates to a die mounting machine; and
    mounting the dies from any of the parts at the die mounting machine using the downloaded locator die coordinates.

12. An apparatus to scan a wafer profile into a computer comprising:
    a flat-bed scanner; and
    vacuum means for holding the wafer's active surface spaced from the scanner glass to prevent damage to the wafer's active surface.

13. An apparatus to scan a wafer profile into a computer comprising:
    a flat-bed scanner; and
    means for holding the wafer's active surface spaced from the scanner glass;
    said means for holding includes a scanner cover that has a vacuum inlet in the cover that is attached to a vacuum source to hold the wafer's flip side while the active surface of the wafer is facing toward the scanner glass surface.

14. The apparatus of claim 13 wherein said scanner cover is a flap hinged to the holder extends over and spaced from a scanner glass of the scanner for holding the wafer.

15. The apparatus of claim 14 including a scanner holder for holding said scanner at a tilted angle of between 50 to 60 degrees.

16. A method of recognizing a locator die comprising the steps of:
    recognizing wafer diameter;
    recognizing quarter or half wafer from the scanned images;
    verifying the reference die validity; and
    recognizing the locator die coordinates.

17. The method of claim 16 wherein the step of recognizing the wafer diameter includes the step of converting the wafer image to a binary image and counting the white pixels.

18. The method of claim 17 including the step of setting a window after finding the tangent of the wafer.

19. The method of claim 16 wherein the step of recognizing quarter or half wafer is by using the image aspect ratio.

20. The method of claim 16 wherein the step of verifying reference die validity includes analyzing the pixel profile of a cross section across the selected reference die.

21. The method of claim 20 wherein said analyzing step includes determining there is no valley to the left of the selected die.

22. The method of claim 16 wherein the step of recognizing the locator die coordinates includes analyzing the pixel profile of a cross section across the selected locator die.

23. The method of claim 22 wherein said analyzing step includes determining there is no valley to the right of the selected die for a horizontal cross section and a valley below the selected die for a vertical cross section.

24. The method of claim 16 wherein the step of recognizing the locator die coordinates includes thresholding, binary gradient, dilated gradient, image fill, image erosion, and vertical/horizontal edge detection.

25. An apparatus to scan a wafer profile into a computer comprising:

a flat-bed scanner having a flat scanner glass; and a scanner cover connected to the scanner for covering the scanner glass and having a holding means on a surface of the cover facing the scanner glass for holding the non-active side of the wafer against the inside of the cover for holding the wafer's active surface spaced from the scanner glass to prevent damage to the wafer's active surface.

* * * * *